(12) United States Patent
Sonderman et al.

(10) Patent No.: US 6,511,898 B1
(45) Date of Patent: Jan. 28, 2003

(54) METHOD FOR CONTROLLING DEPOSITION PARAMETERS BASED ON POLYSILICON GRAIN SIZE FEEDBACK

(75) Inventors: Thomas Sonderman, Austin, TX (US); Jeremy Lansford, Austin, TX (US); Anthony J. Toprac, Austin, TX (US)

(73) Assignee: Advanced Micro Devices Inc., Austin, TX (US)

( * ) Notice: Subject to any disclaimer, the term of this patent is extended or adjusted under 35 U.S.C. 154(b) by 0 days.

(21) Appl. No.: 09/577,769

(22) Filed: May 24, 2000

(51) Int. Cl.[7] .................... H01L 21/20; H01L 21/36
(52) U.S. Cl. ............... 438/488; 438/478; 438/301; 257/412
(58) Field of Search ................... 438/478, 301, 438/303, 305, 306, 528; 257/250, 366, 412

(56) References Cited

U.S. PATENT DOCUMENTS

| | | | |
|---|---|---|---|
| 4,332,833 A | * 6/1982 | Aspnes et al. ............... 427/8 |
| 4,571,685 A | 2/1986 | Kamoshida ................ 364/468 |
| 4,609,903 A | * 9/1986 | Toyokura et al. ............. 338/22 |
| 5,633,177 A | * 5/1997 | Anjum ........................ 438/301 |
| 5,719,495 A | 2/1998 | Moslehi ..................... 324/158.1 |
| 5,835,225 A | 11/1998 | Thakur ....................... 356/381 |
| 5,993,893 A | 11/1999 | Kikuchi ......................... 427/8 |
| 6,160,300 A | * 12/2000 | Gardner et al. ............. 257/412 |
| 6,287,944 B1 | * 9/2001 | Hara et al. .................. 438/488 |

OTHER PUBLICATIONS

PCT International Search Report for PCT/US01/12358, May 14, 2002.

* cited by examiner

Primary Examiner—David Nelms
Assistant Examiner—D Le
(74) Attorney, Agent, or Firm—Williams, Morgan & Amerson, P.C.

(57) ABSTRACT

A processing line includes a deposition tool, a metrology tool and a controller. The deposition tool is adapted to form a polysilicon layer on a wafer in accordance with a recipe. The metrology tool is adapted to measure a grain size of the polysilicon layer. The controller is adapted to modify the recipe for subsequently formed polysilicon layers based on the measured grain size. A method for controlling a deposition process includes forming a polysilicon layer on a wafer in accordance with a recipe; measuring a grain size of the polysilicon layer; and changing the recipe for subsequently formed polysilicon layers based on the measured grain size.

10 Claims, 2 Drawing Sheets

METHOD FOR CONTROLLING DEPOSITION PARAMETERS BASED ON POLYSILICON GRAIN SIZE FEEDBACK

BACKGROUND OF THE INVENTION

1. Field of the Invention

This invention relates generally to semiconductor device manufacturing, and, more particularly, to a method and apparatus for controlling deposition parameters based on feedback of information relating to polysilicon grain size feedback.

2. Description of the Related Art

In the manufacture of semiconductor devices, wafers, such as silicon wafers, are subjected to a number of processing steps. The processing steps include depositing or forming layers, patterning the layers, and removing portions of the layers to define features on the wafer. One such process used to form the layers is known as chemical vapor deposition (CVD), wherein reactive gases are introduced into a vessel, e.g., a CVD tool, containing the semiconductor wafers. The reactive gases facilitate a chemical reaction that causes a layer to form on the wafers.

One exemplary deposition process involves the formation of polycrystalline silicon (polysilicon) layers on the wafer by reacting nitrogen ($N_2$) and silane ($SiH_4$) in a furnace. There are many factors that affect the deposition rate of a deposition tool. These factors include, among other things, the flow rate of reactive gases through the chamber and the temperature of the chamber. Typically, to determine the deposition rate for a particular tool (e.g., when it is first placed in service or after a maintenance event), a series of qualification wafers are processed and the resultant thickness of the process layer is measured. The measurements are used to estimate the deposition rate of the tool. Deposition times for subsequently processed wafers are determined based on the anticipated deposition rate.

Controlling the deposition process as described above helps achieve thickness uniformity, but not necessarily performance uniformity. Typically, a dopant material (e.g., boron, arsenic, phosphorous) is added to the polysilicon layers to lower the resistivity of the resulting layer. Correspondingly, the components of the finished semiconductor devices made from this layer (e.g., a gate electrode) also exhibit this lower resistivity. Generally, a device with a lower resistivity has a potential for a higher speed rating. A primary factor in determining the amount of dopant that can be introduced into the polysilicon is the grain size of the polysilicon. A structure with a smaller grain size has an increased number of grain boundaries, hence more sites for dopant ions to attach and a lower resistivity.

The present invention is directed to overcoming, or at least reducing the effects of, one or more of the problems set forth above.

SUMMARY OF THE INVENTION

One aspect of the present invention is seen in a processing line including a deposition tool, a metrology tool and a controller. The deposition tool is adapted to form a polysilicon layer on a wafer in accordance with a recipe. The metrology tool is adapted to measure a grain size of the polysilicon layer. The controller is adapted to modify the recipe for subsequently formed polysilicon layers based on the measured grain size.

Another aspect of the present invention is seen in a method for controlling a deposition process. The method includes forming a polysilicon layer on a wafer in accordance with a recipe; measuring a grain size of the polysilicon layer; and changing the recipe for subsequently formed polysilicon layers based on the measured grain size.

BRIEF DESCRIPTION OF THE DRAWINGS

The invention may be understood by reference to the following description taken in conjunction with the accompanying drawings, in which like reference numerals identify like elements, and in which.

Figure 1:
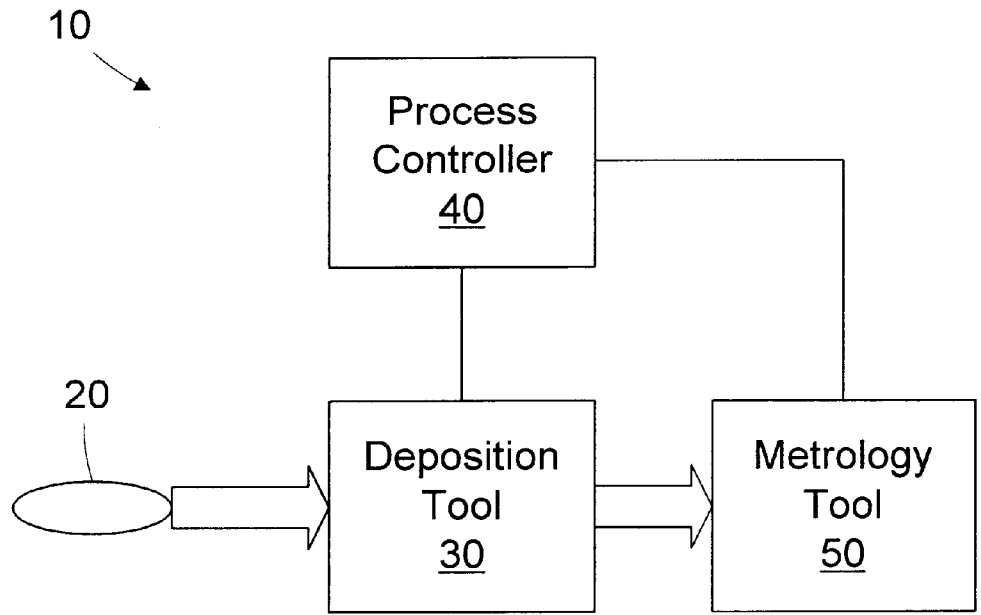
FIG. 1 is a simplified block diagram of a processing line in accordance with one illustrative embodiment of the present invention.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF SPECIFIC EMBODIMENTS

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

Referring first to FIG. 1, a simplified diagram of an illustrative processing line 10 for processing wafers 20 in accordance with the present invention is provided. The processing line 10 includes a deposition tool 30, an process controller 40, and a metrology tool 50. In the illustrated embodiment, the deposition tool 30 is a furnace useful for depositing a polysilicon layer on the semiconductor wafer 20. Reactive gases, including ($N_2$) and silane ($SiH_4$), are provided to the deposition tool 30 to facilitate the polysilicon formation. A suitable deposition tool 30 is a TEL vertical furnace. The process controller 40 interfaces with the deposition tool 30 for modifying operating parameters of the deposition tool 30 based on a model relating the recipe parameters (e.g., deposition time, temperature, gas flow rate, etc.) to polysilicon grain size. The metrology tool 50 provides polysilicon grain size measurements to the process controller 40 for updating the model and predicting future recipe parameters. The deposition tool 30 may have separate control regions that each have an associated operating recipe. For example, a vertical furnace typically has a plurality of control zones. The zone at the top zone operates and is controlled differently than a zone near the bottom of the furnace. In an implementation where the deposition tool 30 has distinct control regions, the process controller 40 may modify each recipe independently, and may also use a separate model for each zone.

The process controller 40 contains a model of recipe parameters for the deposition tool 30 based on polysilicon grain size. The model may be generated and/or updated based on input from the metrology tool 50 and the recipe parameters used to form the wafer 20 measured. Exemplary metrology tools 50 suitable for measuring the polysilicon grain size are a KLA 8100 scanning electron microscope offered by KLA-Tencor Corporation, an Opal 7830 offered by Applied Materials, Inc., or a Dimension 9000 atomic force microscope offered by Digital Instruments.

In the illustrated embodiment, the process controller 40 is a computer programmed with software to implement the functions described. However, as will be appreciated by those of ordinary skill in the art, a hardware controller designed to implement the particular functions may also be used. Portions of the invention and corresponding detailed description are presented in terms of software, or algorithms and symbolic representations of operations on data bits within a computer memory. These descriptions and representations are the ones by which those of ordinary skill in the art effectively convey the substance of their work to others of ordinary skill in the art. An algorithm, as the term is used here, and as it is used generally, is conceived to be a self-consistent sequence of steps leading to a desired result. The steps are those requiring physical manipulations of physical quantities. Usually, though not necessarily, these quantities take the form of optical, electrical, or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise, or as is apparent from the discussion, terms such as "processing" or "computing" or "calculating" or "determining" or "displaying" or the like, refer to the action and processes of a computer system, or similar electronic computing device, that manipulates and transforms data represented as physical, electronic quantities within the computer system's registers and memories into other data similarly represented as physical quantities within the computer system memories or registers or other such information storage, transmission or display devices.

An exemplary software system capable of being adapted to perform the functions of the process controller 40 described is the ObjectSpace Catalyst system offered by ObjectSpace, Inc. The ObjectSpace Catalyst system uses Semiconductor Equipment and Materials International (SEMI) Computer Integrated Manufacturing (CIM) Framework compliant system technologies and is based the Advanced Process Control (APC) Framework. CIM (SEMI E81-0699—Provisional Specification for CIM Framework Domain Architecture) and APC (SEMI E93-0999—Provisional Specification for CIM Framework Advanced specifications are publicly available from SEMI.

Based on the polysilicon grain size measured by the metrology tool 50, the process controller 40 predicts operating recipe parameters for changing the polysilicon grain size for the next lot to a target value. The primary factors that affect grain size are temperature and gas flow rate. Temperature has the most pronounced effect. An increased temperature results in a generally linear increase in grain size. Depending on the specific process parameters, the reactant gas flow rates may also affect the grain size.

Changing the temperature and gas flow rates affects not only grain size, but also deposition rate. The deposition process model may be configured to adjust the deposition time based on the changes to the other control parameters to account for deposition rate changes. In essence, there may be two models, one predicting temperature and or gas flow rate for a target grain size, and one for predicting a deposition time for particular temperature and gas flow parameters.

In changing the recipe, the process controller 40 may change a parameter or parameters within a baseline recipe or, alternatively, the process controller 40 may provide an entirely new recipe. For example, the process controller 40 may incrementally increase or decrease the previous temperature (e.g., by 0.5° C.) in the recipe or it may determine a new absolute temperature based on the grain size measurement (i.e., grain size X corresponds to a temperature of 625° C.). A change in the deposition time may also be incremental or absolute based on the change in the temperature.

The deposition process model or models may be generated by the process controller 40, or alternatively, they may be generated by a different processing resource (not shown) and stored on the process controller 40 after being developed. The deposition process model may be developed using the process tool 30 or on a different tool (not shown) having similar operating characteristics. For purposes of illustration, it is assumed that the deposition process model is generated and updated by the process controller 40 or other processing resource based on actual performance of the deposition tool 30 as measured by the metrology tool 50. The deposition process model is trained based on historical data collected from numerous processing runs of the deposition tool 30. Various modeling techniques, well known to those of ordinary skill in the art, are suitable. Exemplary modeling techniques include neural network modeling, principal component analysis (PCA), and projection to latent structures (PLS).

The following example is provided as a high-level illustration of how a model of the deposition tool 30 may be generated. The specific implementation of the deposition process model may vary depending on the modeling technique selected, and such specific implementation is well known to those of ordinary skill in the art. Thus, for clarity and ease of illustration, such specific details are not described in greater detail herein.

Figure 2:
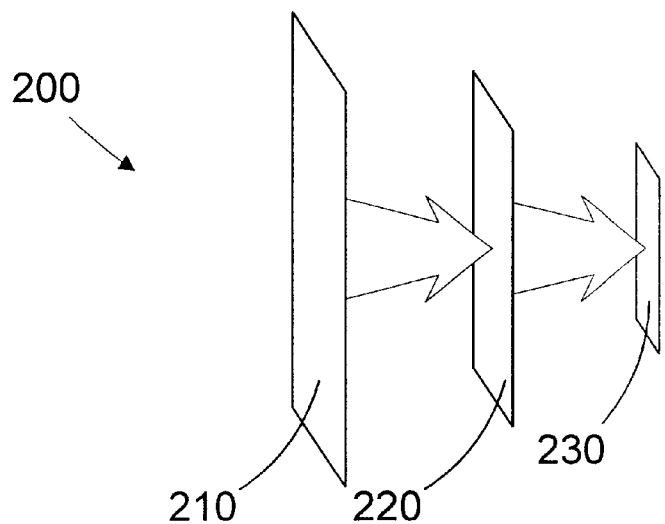
FIG. 2 is a simplified diagram of a neural network modeling system in accordance with one embodiment of the present invention.

Turning briefly to FIG. 2, a simplified diagram of a neural network 200 is provided. The neural network 200 includes an input layer 210, a hidden layer 220, and an output layer 230. The input layer 210 receives those input values deemed appropriate for modeling the performance of the deposition tool 30. In the illustrated embodiment, the polysilicon grain size, as measured by the metrology tool 50, is received as an input, although other inputs may also be used. The hidden layer 220 "learns" the effects that the recipe parameters have on determining the polysilicon grain size during a training procedure by which the neural network 200 is exposed to historical performance data of the deposition tool 30 or a similar deposition tool (not shown). The hidden layer 220 weights each of the inputs and/or combinations of the inputs to predict future performance. Through analysis of historical data, the weighting values are changed to try to increase the success at which the model predicts the future performance. The output layer 230 distills the manipulation of the hidden layer 220 to generate a prediction of, for example, the temperature, gas flow rate, or deposition time required to form the polysilicon layer with the target grain size.

Once the model is sufficiently trained, it may be used in a production environment to predict the operation of deposition tool 30 based on current input value measurements. Based on the results predicted by the neural network 200, the deposition control parameters are predicted, and the operating recipe of the deposition tool 30 is modified accordingly. In the production environment, periodic measurements from the metrology tool 50 are provided as feedback to the process controller 40 for updating the deposition process model.

During model generation or updating, the metrology tool 50 may take grain size measurements from process layers fabricated in different zones of the deposition tool 30. For example, one sample may be taken from wafers 20 near the top (i.e., for a vertical furnace) or one end (i.e., for a horizontal furnace) of the deposition tool 30. These measurements may be used in conjunction with the model to change parameters in the zones independently.

Figure 3:
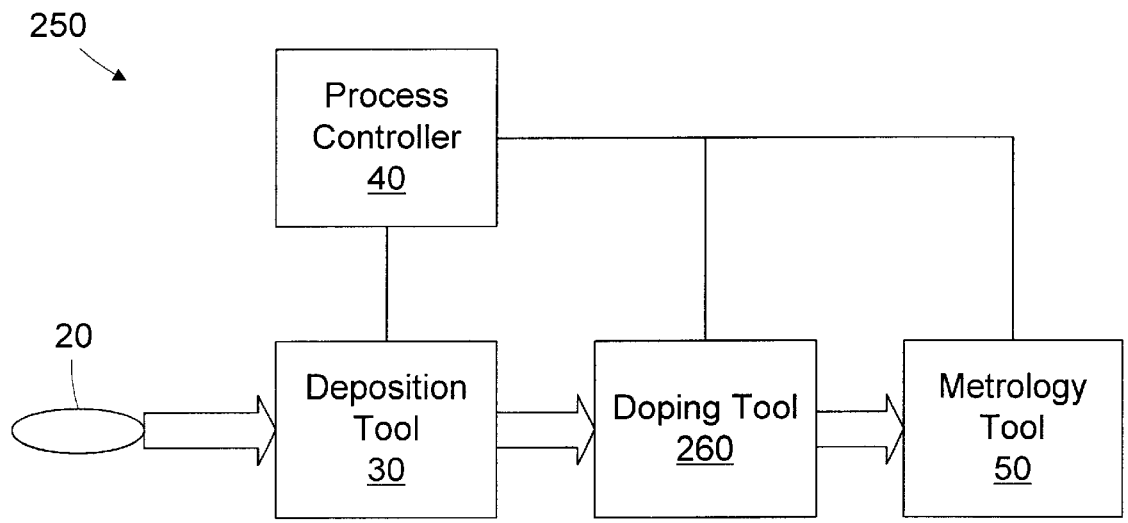
FIG. 3 is a simplified block diagram of a processing line in accordance with an alternative illustrative embodiment of the present invention.

In another embodiment, the metrology tool 50 may be adapted to measure resistivity of the wafers 20 after they have been doped to saturation. The resistivity provides an indirect measurement of grain size. An exemplary resistivity measuring tool suitable for use as the metrology tool 50 in this embodiment is a VP10e offered by Prometrix. The doping of the wafers 20 may be performed within the deposition tool 30 or in a subsequent tool. An exemplary process for doping the polysilicon includes coating the wafers 20 with a dopant, such as $POCl_3$ after forming the polysilicon layer and heating the wafers 20 to diffuse the dopant into the polysilicon layer. An alternative external doping process is implantation. A processing line 250 including an external doping tool 260 is shown in FIG. 3. In one illustrative embodiment, the doping tool 260 is an ion implantation tool. Of course, the invention may be practiced with the doping tool 260 (i.e., measuring resistivity) or without the doping tool 260 (i.e., measuring grain size). Also, the doping tool 260 may be considered integral to the deposition tool 30 when an in situ doping process is used.

Due to the time required to measure the grain size and/or the resistivity, there may be a lag of one or more lots before the operating recipe of the deposition tool 30 can be updated. The process controller 40 updates the operating recipe as soon as data from the metrology tool is available and is processed in accordance with the deposition process model.

Figure 4:
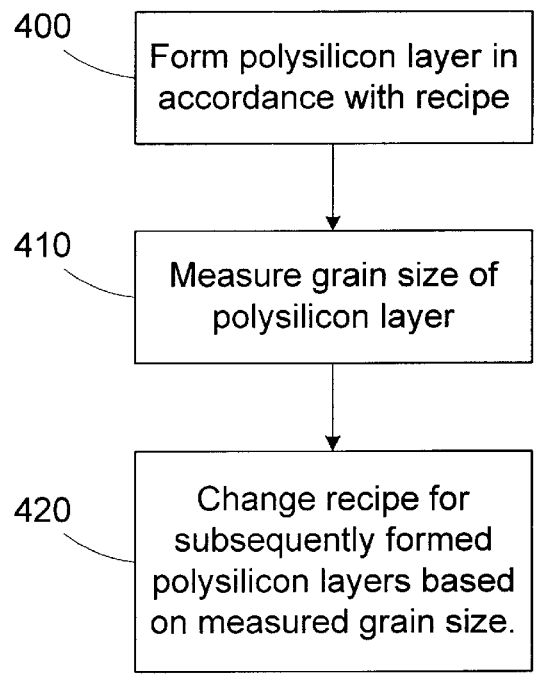
FIG. 4 is a flow diagram of a method for controlling a deposition process parameters based on polysilicon grain size feedback in accordance with one aspect of the present invention.

Referring now to FIG. 4, a flow diagram of a method for controlling deposition parameters based on polysilicon grain size is provided. In block 400, a polysilicon layer is formed on a wafer in accordance with a recipe. In block 410, a grain size of the polysilicon layer is measured. In block 420, the recipe for subsequently formed polysilicon layers is changed based on the measured grain size.

Using polysilicon grain size feedback to alter operating recipe parameters for subsequent production runs as described above has numerous advantages. First, by controlling the polysilicon grain size, the consistency of the performance of the devices produced is increased. Generally, tighter process control yields higher a higher percentage of faster, more profitable, semiconductor devices. Second, the process control is performed on a run-by-run basis. This allows incremental changes in the performance of the deposition tool 30 to be addressed such that the polysilicon grain size consistency can be maintained.

The particular embodiments disclosed above are illustrative only, as the invention may be modified and practiced in different but equivalent manners apparent to those skilled in the art having the benefit of the teachings herein. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method for controlling a deposition process, comprising:

forming a polysilicon layer on a wafer in accordance with a recipe;

measuring a grain size of the polysilicon layer; and changing the recipe for subsequently formed polysilicon layers based on the measured grain size.

2. The method of claim 1, wherein changing the recipe includes changing a temperature in the recipe.

3. The method of claim 2, wherein changing the recipe includes changing a deposition time in the recipe based on the change to the temperature.

4. The method of claim 1, wherein changing the recipe includes changing at least one gas flow rate in the recipe.

5. The method of claim 4, wherein changing the recipe includes changing a deposition time in the recipe based on the change to the gas flow rate.

6. The method of claim 1, wherein measuring the grain size comprises measuring the grain size using at least one of a scanning electron microscope and an atomic force microscope.

7. The method of claim 1, further comprising doping the polysilicon layer, wherein measuring the grain size comprises:

measuring the resistivity of the doped polysilicon layer; and correlating the measured resistivity to the grain size.

8. The method of claim 2, wherein changing the temperature includes decreasing the temperature in response to the measured grain size being greater than a target grain size.

9. The method of claim 2, wherein changing the temperature includes increasing the temperature in response to the measured grain size being less than a target grain size.

10. The method of claim 4, wherein changing the gas flow rate includes decreasing at least one gas flow rate in response to the measured grain size being greater than a target grain size.

\* \* \* \* \*